United States Patent
Hazelton et al.

(10) Patent No.: US 6,880,942 B2
(45) Date of Patent: Apr. 19, 2005

(54) ADAPTIVE OPTIC WITH DISCRETE ACTUATORS FOR CONTINUOUS DEFORMATION OF A DEFORMABLE MIRROR SYSTEM

(75) Inventors: Andrew J. Hazelton, San Carlos, CA (US); W. Thomas Novak, Hillsborough, CA (US); Alton H. Phillips, Mountain View, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 130 days.

(21) Appl. No.: 10/460,644

(22) Filed: Jun. 13, 2003

(65) Prior Publication Data

US 2004/0036940 A1 Feb. 26, 2004

Related U.S. Application Data

(60) Provisional application No. 60/390,159, filed on Jun. 21, 2002, provisional application No. 60/390,157, filed on Jun. 21, 2002, and provisional application No. 60/390,806, filed on Jun. 20, 2002.

(51) Int. Cl.[7] .................................. G02B 5/08
(52) U.S. Cl. .................. 359/849; 359/850; 359/851
(58) Field of Search ................ 359/849–851, 359/221–224, 846, 819; 356/515–520

(56) References Cited

U.S. PATENT DOCUMENTS

| | | | |
|---|---|---|---|
| 3,857,636 A | * 12/1974 | Angelbeck | ................. 356/450 |
| 4,201,473 A | * 5/1980 | Domenicali et al. | ........ 356/514 |
| 4,408,874 A | 10/1983 | Zinky et al. | |
| 4,492,431 A | 1/1985 | Eitel et al. | |
| 4,632,523 A | 12/1986 | Knohl | |
| 4,655,563 A | * 4/1987 | Plante et al. | ................. 359/849 |
| 4,696,572 A | * 9/1987 | Ono | ........................... 356/458 |

(Continued)

FOREIGN PATENT DOCUMENTS

| | | |
|---|---|---|
| EP | 0 569 595 A1 | 11/1992 |
| EP | 0 961 149 A2 | 5/1999 |
| WO | WO 02/12948 A2 | 2/2002 |
| WO | WO 02/37162 A2 | 5/2002 |

*Primary Examiner*—Mohammad Sikder
(74) *Attorney, Agent, or Firm*—Whitman, Curtis & Christofferson, PC

(57) ABSTRACT

Adaptive optical elements for use in high precision lithography exposure are provided with an array of discrete actuators to provide highly stable and repeatable correction of the shape of an optical element to an accuracy of a small fraction of a very short wavelength of light in the EUV range of 1 to 50 nanometers, responsive to a metrology source and sensor arrangement. The actuators are matched to the deformation characteristics of the adaptive optical elements. Preferably, the actuators provide both positive and negative force for outward and/or inward deflection continuously over the surface of the mirror. The surface of the optical element may thus be accurately, controllably and repeatably deformed to within an allowable deformation limit to optimize optical performance of an optical system for high precision lithography exposure.

16 Claims, 4 Drawing Sheets

U.S. PATENT DOCUMENTS

| | | | |
|---|---|---|---|
| 4,841,832 A | 6/1989 | Snavely et al. | |
| 5,115,351 A | 5/1992 | Miyawaki et al. | |
| 5,142,132 A | 8/1992 | MacDonald et al. | |
| 5,204,784 A | 4/1993 | Spinhirne | |
| 5,298,971 A * | 3/1994 | Huang et al. | 356/520 |
| 5,309,717 A | 5/1994 | Minch | |
| 5,414,564 A | 5/1995 | Pausch et al. | |
| 5,420,436 A | 5/1995 | Seya et al. | |
| 5,685,149 A | 11/1997 | Schneider et al. | |
| 5,828,455 A | 10/1998 | Smith et al. | |
| 5,831,780 A | 11/1998 | Krim | |
| 5,966,795 A | 10/1999 | Pagano et al. | |
| 5,986,795 A * | 11/1999 | Chapman et al. | 359/224 |
| 6,043,863 A | 3/2000 | Ikeda | |
| 6,193,381 B1 | 2/2001 | Holler | |
| 6,211,598 B1 | 4/2001 | Dhuler et al. | |
| 6,233,056 B1 | 5/2001 | Naulleau et al. | |
| 6,360,956 B1 | 3/2002 | Taylor et al. | |
| 6,388,823 B1 | 5/2002 | Gaber et al. | |
| 6,398,373 B1 | 6/2002 | Guzman et al. | |
| 2002/0011673 A1 | 1/2002 | Uzoh | |

* cited by examiner

Top View

Side View

ADAPTIVE OPTIC WITH DISCRETE ACTUATORS FOR CONTINUOUS DEFORMATION OF A DEFORMABLE MIRROR SYSTEM

This application claims priority from U.S. Provisional Application Ser. No. 60/390,806 filed Jun. 20, 2002 entitled "Pneumatic actuators for a deformable mirror for microlithography" and also from U.S. Provisional Application Ser. No. 60/390,157 filed Jun. 21, 2002 entitled "Deformable mirror thermal actuation system" and also from U.S. Provisional Application Ser. No. 60/390,159 filed Jun. 21, 2002 entitled "Adaptive optic with air bladders."

BACKGROUND OF THE INVENTION

1. Field of the Invention

The present invention generally relates to high precision imaging using a reflective optical element and, more particularly, to high precision lithography exposure systems and methods using one or more adaptive, reflective optical elements to minimize aberrations and measurement and control therefor.

2. Description of the Prior Art

Many manufacturing and scientific processes require the use of optical systems having extremely high accuracy and precision and freedom from aberrations as well as the ability to make observations and/or exposures in wavelength regimes well outside the visible spectrum. For example, at least one lithographic exposure process is invariably required for establishing the location and basic dimensions of respective electrical or electronic elements in semiconductor integrated circuits in which the number of such elements on a single chip can extend into the tens if not hundreds of millions. The respective electrical or electronic elements can be very small and placement in close proximity, sometimes referred to as high integration density, is highly desirable in order to reduce signal propagation time and susceptibility to noise as well as to achieve other advantages such as increased functionality and, in some cases, manufacturing economy. These circumstances provide strong incentives to develop smaller minimum feature size regimes which must be established through lithographic exposures of a resist. Therefore, resolution and aberration of the exposure must be held within a very closely defined budget which is a small fraction of the minimum feature size.

The resolution of any optical system is a function of the wavelength of the energy used for the exposure although some arrangements such as phase-shift masks have allowed exposure resolution to be extended below the wavelength of the exposure radiation. Nevertheless, resolution of extremely small features requires correspondingly short wavelengths of radiation. Accordingly, use of X-rays for lithographic exposure are known but not widely known due to the requirement for fabrication of an exposure mask at the same minimum feature size as the final desired pattern since reduction of the size of the pattern cannot be achieved with X-rays. Optical and electron beam projection systems, however, can achieve such image pattern size reduction in the exposure pattern relative to feature sizes in a reticle which establishes the pattern to be exposed.

However, between these two techniques, reticles for electron beam projection are generally far more expensive than optical reticles and, perhaps more importantly, require many more exposures to form a complete integrated circuit pattern since the exposure field at the chip is comparatively more limited in electron beam projection systems. Therefore, there is substantial continued interest in optical lithographic exposure systems and extending their capabilities to shorter wavelengths, such as extreme ultraviolet (EUV).

EUV wavelengths are generally considered to be in the range of about 1 to 50 nanometers. For lithographic exposure a suitable wavelength is in the range of 12 to 14 nanometers and, more specifically, within a range of less than one nanometer in a band centered on 13.5 nanometers. At such wavelengths, most imaging materials which are transparent in the visible spectrum and which are suitable for lenses are substantially opaque to the imaging radiation. Therefore, optical systems have been developed and are known which have only reflective elements. Such fully reflective systems are usually more complex than lens systems since interference between illumination of the reticle and illumination of the target with the projected pattern must be avoided. This generally means that the number of elements must often be increased and the freedom from aberrations maintained or well-corrected throughout the entire optical system. The maintenance of high manufacturing yield in the above-discussed exemplary environment thus requires not only high stability of the optical system but frequent measurement and adjustment to assure an adequately high level of optical performance of the system.

While techniques of measurement of wave-front aberrations are well-known and sufficient to accurately characterize the performance of optical systems and elements thereof, practical arrangements for conducting such measurements are difficult and complex. For instance, measurements cannot be made on axis or within the exposure/projection field during an exposure without interference with that exposure (e.g. by casting shadows or otherwise occupying a potion of the focal plane of the system where the target is located). Measurements performed between exposures cannot be regarded as measurements of optical performance during the exposure itself and do not directly characterize the lithographic image itself, but are often the only practical solution at the current state of the art even though sources of error may be introduced thereby. Optical performance generally degrades with increasing distance from the optical axis of the system and, as a practical matter, it is desirable, for projection of the desired image, to use the full extent of the optical field where sufficient precision, resolution and freedom from aberrations can be maintained. This objective generally precludes measurements which, in any event, may not directly or even predictably correspond to the on-axis performance of the element or system.

Active optics are known but have not been widely used to date in such systems. Active optics involve the ability to change the overall or local shape of optical elements to alter the optical properties of the element. The article "Active Optics: A New Technology for the Control of Light" by John W. Hardy, Proc. of the IEEE, Vol 66, No. 6, June, 1978, provides an overview of this technology and is hereby fully incorporated by reference. In particular, some general suggestions for provision of mechanical arrangements for achieving localized or generalized deformations of reflecting optical elements to achieve different optical effects such as compensating for atmospheric turbulence. However, mechanical actuators which deflect portions of the optical element (such as are disclosed therein) may present numerous problems of stability, hysteresis and the like and may be unsuitable for optical element deformations which may be only a relatively small fraction of a very short wavelength.

Thus there is a need for a system of deformable optics able to operate within the EUV range and able to detect aberrations and correct detected aberrations to within an allowable deformation limit that is a small fraction (nominally one-tenth) of an EUV wavelength.

SUMMARY OF THE INVENTION

It is therefore an object of the present invention to provide an optical system operable at EUV wavelengths and controlling one or more adaptive optical elements for optimization of optical performance and minimization of aberrations to less than an allowable deformation limit with reference to an optimal design shape of the adaptive optical elements.

The invention provides an apparatus for controlling optical element deformation continuously over the surface of a deformable optical element, where the reactive forces used to deform the mirror are applied at a plurality of discrete points to achieve a continuous deformation adequate to correct aberrations in an optical system operating at EUV wavelengths. Aberrations are detected with reference to a design shape In one embodiment pressure is applied directly to contiguous local areas of the optical element via a plurality of air bellows arrayed conformably to the back surface of a deformable optical element. In another embodiment a thermal gradient to an optical element having a thermal coefficient of expansion is established via a plurality of thermal actuators arrayed conformably to the back surface of a deformable optical element. By controlling each of the plurality of actuators in combination there is provided a desired or aberration-compensating performance of the optical element.

The invention provides an optical system having one or more deformable mirrors for use with EUV wavelengths in the range of 1 to 50 nanometers. The deformable mirrors have an optimal design shape for high precision lithography exposure. The system includes a metrology for detecting aberrations in the optical system, and an array of actuators for deforming the deformable mirrors, the deformations being controllable by the actuators to within an allowable deformation limit of the optimal design shape. Finally, there is provided means responsive to the metrology for controlling the actuators to correct the aberrations to within the allowable deformation limit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
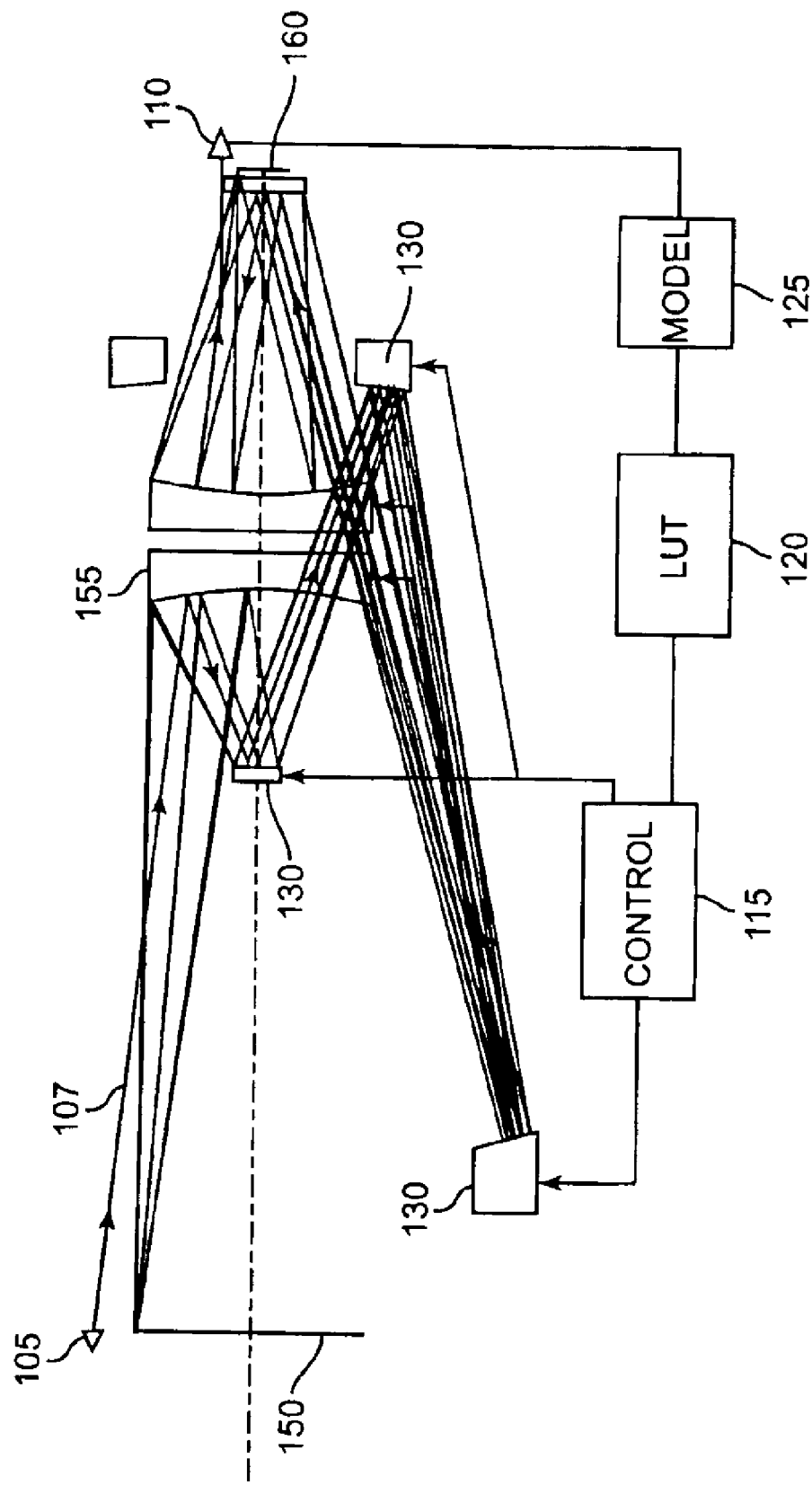
FIG. 1 is a schematic diagram of a preferred embodiment of the overall system of the invention as applied to a catoptic optical system.

Referring now to the drawings, and more particularly to FIG. 1, there is shown an exemplary catoptic optical system with which the invention may be employed. All optical elements of this system are reflective and thus this optical system is suitable for projection of EUV wavelengths or for use in any reflective element of any optical system. The illustrated optical system is suitable for image projection of a pattern established by the reticle 150 via a pupil 155 onto a target such as a resist-coated wafer 160. It should be further noted that this optical system is relatively complex; including six mirrors and having a tortuous optical path among the elements and principally off-axis which, itself, may give rise to significant aberrations.

In accordance with the invention, adaptive optics may be employed for any or all elements of the optical system of FIG. 1 or any similar system having reflectors for all elements thereof and thus capable of projecting an image using EUV radiation. However, it is necessary to provide for measurements of any existing aberrations at least periodically (e.g. possibly as infrequently as once per week for measurement of total aberration) such that corrective action can be taken to adjust the adaptive optic to reduce aberrations to an allowable amount. In the best mode of implementation of the invention, the range of EUV radiation is nominally between 12 and 14 nanometers and optimally 13.5±0.1 nanometers. In the best mode, the allowable deformation limit is nominally one-tenth of the EUV wavelength and optimally less than 1 nanometer.

The metrology system in accordance with the invention is installed as part of the projection lens. A light source 105, possibly with a wavelength different from the exposure wavelength (as is possible since no optical elements are refractive) is situated slightly off from the exposure light passing the reticle, depicted as a location on the reticle 150. Because the metrology light source 105 is off from the exposure light and the target/wafer 160 generally corresponds with the area of at least a portion of the reticle, the output metrology beam 107 will be in a different location from the wafer being exposed. Therefore, it is possible to locate a sensor 110 at the output location and to measure the aberration during exposure or without significant interruption of the exposure process. Accordingly, conditions of exposure may be fully or substantially maintained during measurement. It is also possible to sample a portion of the metrology output during changes or alignment and then splice the partial results together to create a map of the aberration(s). Because the metrology is slightly off-axis, a model 125 such as may be empirically derived, possibly including interpolation, and preferably in the form of a look-up table (LUT) 120, to correlate the metrology results with actual performance and corrections appropriate to optimize performance.

Once the aberrations of the system are determined from the aberrations detected by the off-axis (or on-axis) metrology system through, for example, modeling via a model 125, the appropriate corrections of the shape of any or all optical elements of the system may be determined from, for example, an empirically developed look-up table (LUT) 120 and corrections passed to a control arrangement 115, the details of which are unimportant to the practice of the invention, to control suitable mechanical arrangements for altering the shape of the adaptive optical elements 130.

Figure 2A:
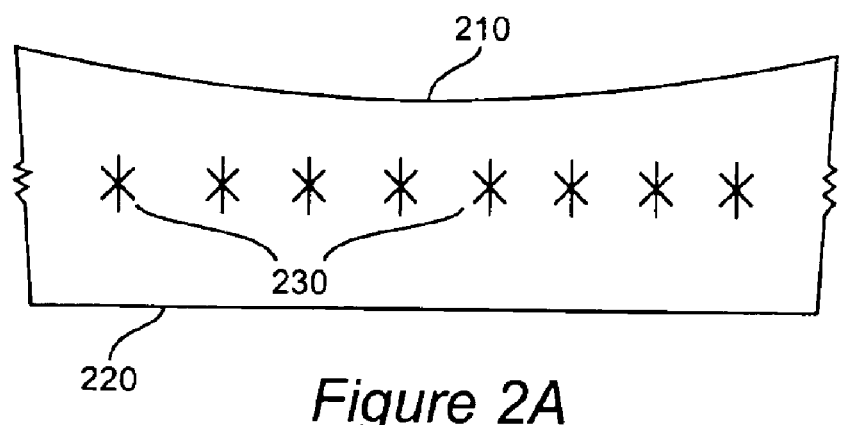
FIG. 2A is a schematic diagram of cross-sectional view of a mirror incorporating a preferred embodiment of the invention.

The essential details of the optical elements 130 may be described with respect to FIG. 2A, which shows a cross section of an optical element. The mirror surface 210 is shown as concave, but may be of any shape (e.g. convex or flat) as dictated by the placement of the element in a given optical system design. Similarly, the mirror surface 210 is deformable, and the deformable characteristics of the mirror are matched to the type and location of actuators 230, as will be described hereafter with respect to preferred embodiments. Operation of the actuators 230 may be supported by a body or substrate 220 connected to the optical element 210. While some different arrangements are known and have been designed in view of a wide range of possibly desirable attributes, the present invention seeks to provide the attributes of potentially high spatial frequency actuation (up to $10^{th}$ order correction) while avoiding abrupt shape change of the optical surface, low cost per actuation channel and high stability while exhibiting little or no holding power. These attributes are desirable for the high accuracy, resolution and degree of freedom from aberrations, the ability to make minute adjustments of a small fraction of a very short wavelength which are selective to relatively minute regions of the optical element at a practical cost and high stability while having little or no hysteresis or mechanical memory which could cause an error in actual adjustment from an adjustment which is empirically derived or compromise repeatability. In order to achieve these attributes a plurality of discrete actuators 230 is arrayed over the back side of the optical surface and conformably thereto as shown in the top view of FIG. 2B and the side view of FIG. 2C.

Figure 3A:
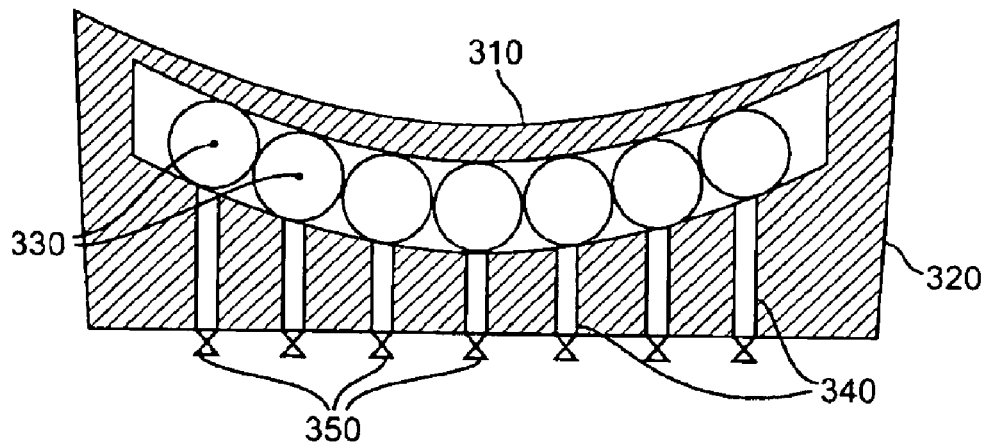
FIG. 3A is a schematic diagram showing a first alternative form of a mirror and actuators in accordance with the invention, the actuator being an air pressure actuator, as shown in FIG. 3B, or an air pressure actuator with spring, as shown in FIG. 3C.

One preferred arrangement of providing an adaptive optical element in accordance with the invention is shown in cross-section in FIG. 3A, where an optical element in accordance with the invention has a relatively thin mirror body 310 (not shown to scale) so that relatively small forces can cause deformation. A relatively thick and relatively more rigid substrate body 320 is placed behind the mirror body. The edges of the mirror body can be attached to the substrate body in any desired fashion such as with adhesives or bolting or formed monolithically therewith. In this embodiment of the invention, actuators for controlling deformation of the mirror body 310 are provided in the form of bladders 330 placed between the mirror body and the substrate as actuators. These bladders exert forces on the mirror when a fluid such as air (as is preferred) is added or removed therefrom.

The bladders may be formed at any size but are preferably very small and arrayed contiguously in accordance with the area over which shape correction of the optical element is desired. Small ducts 340 and valves 350 are provided as pressure ports in the substrate body 320 at a spacing corresponding to the size and/or spacing of the bladders and are preferably connected to an external source of pressure and/or vacuum (not shown) to allow adjustment of internal pressure in each respective bladder. The bladders may be fabricated in the form of sealed bags and may be made of rubber or any other flexible and elastic membrane. Once the desired shape of the optical element has been achieved, as determined, for example, by measurement of system aberrations as described above, the pressure can be maintained using a pressure regulator or by sealing the port.

In operation, the mirror distortion which can derive from manufacturing variations, thermal distortion, mounting distortion, etc. is mapped using some external measurement instrument such as that described above, a Fizeau interferometer or the like and a computational algorithm of a type familiar to those skilled in the art is employed to compute the appropriate optical correction and the pressure required to achieve it for each bladder in order to compensate for the distortion.

It is contemplated that the bladder will generally use positive pressure, but a vacuum or negative pressure can be used as well. If the use of negative pressure or a combination of negative and positive pressure is considered inconvenient, the mirror could be manufactured with a slight "pre-distortion" (e.g. slightly more concave or less convex than the final desired shape) so that positive pressure only is adequate for any correction found necessary or desirable. Alternatively, the bladders could be manufactured with permanent partial inflation of a fraction of their maximum operating pressure.

Figure 3B:
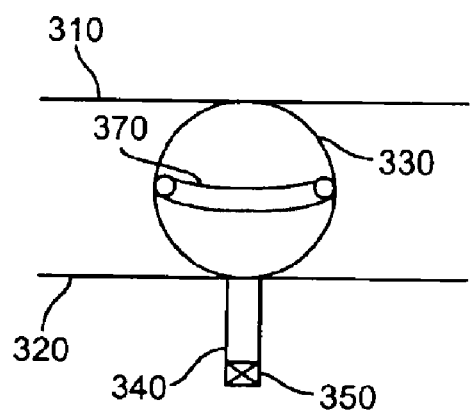

Alternatively, FIG. 3B shows a preferred structure for the air bladders when negative pressure may be used in the bladder. In such a case, the bladder will partially collapse and the partial collapse must be controlled in order to regulate the force applied to the mirror. As shown in FIG. 3B, the bladder is bonded to the mirror and the substrate with adhesive or the like and a lateral reinforcement 370 such as a rigid ring or thickened wall of the bladder is provided to stiffen the lateral perimeter of the bladder. Thus, when a vacuum is applied to the interior of the bladder, the bladder will preferentially collapse in a direction extending between the point of bonding to the mirror body and the substrate body to pull the mirror inwardly.

Figure 3C:
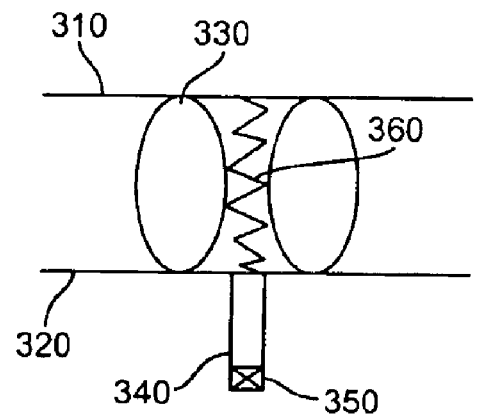

A further alternative arrangement is shown in cutaway FIG. 3C in which the bladder 330 is formed in an annular or doughnut shape and a tension spring 360 is located at the central opening thereof. In this case, internal pressure in the bladder tends to counteract the force of the spring, allowing somewhat improved control and providing the possibility of allowing inward deflection of the mirror without the need for supplying negative pressure to the bladders. In other words, with the arrangement of FIG. 3C, both inward and outward deflection of the mirror 310 can be achieved using only different amounts of positive pressure.

Figure 4:
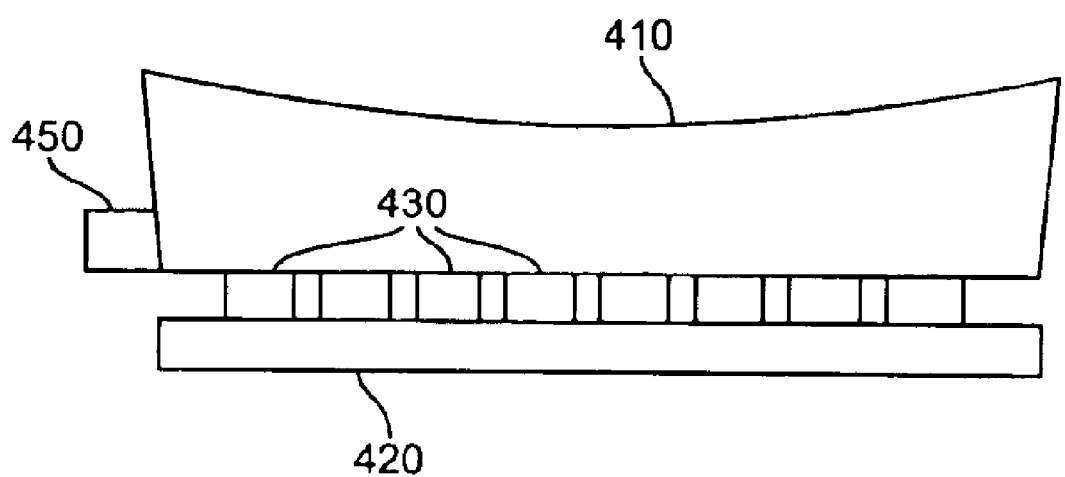
FIG. 4 is a schematic diagram showing a second alternative form of mirror and actuators in accordance with the invention, the actuator being a thermal actuator.

Another preferred arrangement for the invention is shown in cross-section in FIG. 4. In this embodiment, an optical element in accordance with the invention has a mirror body 410 which is of sufficient thickness to provide the desired small surface deflection in accordance with the coefficient of thermal expansion of the material thereof and the thermal excursion which can be provided by thermal actuators 430 which may be resistive elements (for heating), peltier junctions (for cooling) and the like and combinations thereof. Details of these thermal actuators are not important to the basic principles of the invention.

These thermal actuators 430 of whatever nature are preferably provided on the back of the mirror body 410 between the mirror body 410 and a heat sink 420. By such an arrangement, the thermal actuators 430 can control movement of heat into or out of the mirror body to control thermal expansion thereof. A plurality of kinematic mounts 450, preferably three in number (only one is shown in FIG. 4) and located at 120° intervals around the circumference of the mirror, are provided to provide a secure mounting of the mirror without transferring stress thereto. The kinematic mounts are also preferably placed near the back surface of the mirror. By doing so, heating of the mirror body and corresponding expansion thereof will cause more movement of the front, reflective surface of the mirror (which may be concave, as shown, or flat or convex, as dictated by its use in the optical system such as that of FIG. 1) than the back since more material of the mirror body is to the front of the kinematic mount. This, of course, can be altered at will in design to tune the mirror surface movement to the selectivity and resolution of temperature control by the thermal actuators 430.

Figure 2B:
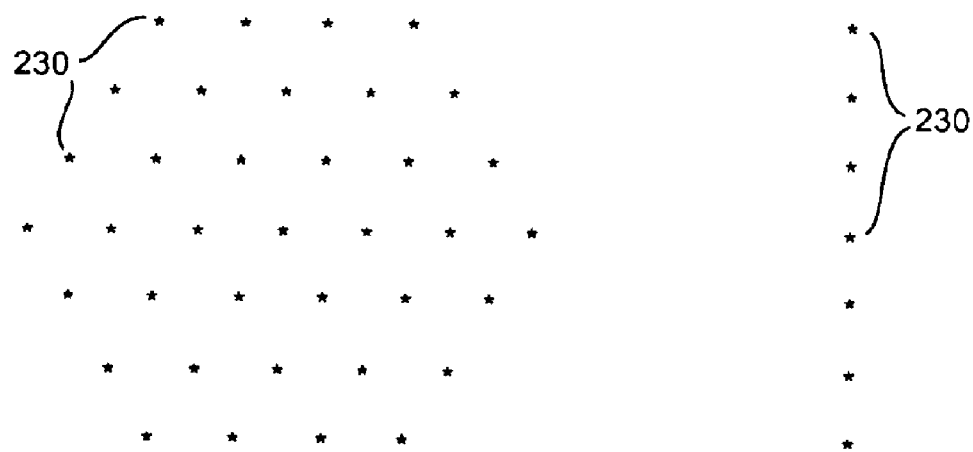
FIGS. 2B and 2C, respectively, are schematic diagrams of a plan view and a side view showing locations of the discrete actuators in accordance with a preferred embodiment of the invention.
Figure 2C:

Preferably, the thermal actuators 430 are arranged in a planar array as shown in FIG. 2B, with all actuators equidistant from each other, effectively at apices of equilateral triangles with which the rear surface of the mirror body may be considered to be tiled. If desired, heat sensors may be provided for feedback in a similar array located similarly or at the centroid of each equilateral triangle. However, in general, it is considered that such feedback will not be necessary since feedback is also provided through measurement of aberrations of the catoptic optical system. Further, except in applications with extremely high intensity of projection illumination, there will be little localized heating of the optical elements from the projected image incident thereon since the reflectivity of front surface mirrors is very high. The thermal expansion of the mirror will also be stabilized by its thermal mass and the efficiency of heat sinking applied thereto. In this regard, it is preferred that heat sinking be provided to a relatively well regulated temperature which will improve relative repeatability of corrections as well as provide thermal stabilization of the overall element or optical system. The arrangement of thermal actuators is inherently stable and with feedback from either or both of temperature sensors and/or aberration measurements will allow calibration and adjustment to be performed relatively infrequently.

Accordingly, it is seen that the invention provides a system of actuators for an adaptive optical element which has no moving parts and which provides rapid, highly repeatable and precise adaptive deformation of the mirror surface within a small fraction of a very short wavelength of light (or potentially a much larger deformation) and which can be readily applied to any or all reflective optical elements of an optical system including elements of systems including refractive elements. The respective channels for correction of respective areas of the optical element can be formed very simply and inexpensively and in close proximity to economically allow high spatial frequency correction.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. In an optical system having reflective elements, an adaptive optic for high precision lithography exposure, comprising:
    an optical system having one or more deformable mirrors for use with EUV wavelengths in the range of 1 to 50 nanometers, said deformable mirrors having an optimal design shape;
    a metrology system for detecting aberrations in the optical system;
    an array of actuators for deforming the deformable mirrors, said deformations being controllable by said actuators to within an allowable deformation limit of said optimal design shape; and
    a control system responsive to said metrology system to control the actuators to correct the aberrations to within said allowable deformation limit of said optimal design shape.

2. An adaptive optic as in claim 1, wherein said actuators are flexible chambers operable by fluid pressure.

3. An adaptive optic as in claim 2, wherein said flexible chambers are fitted with a lateral reinforcement member.

4. An adaptive optic as in claim 2, wherein said flexible chambers are in an annular shape and a tension spring is located at a center of the chamber and perpendicular to the mirror surface.

5. An adaptive optic as in claim 2, wherein said fluid is air.

6. An adaptive optic as in claim 1, wherein said actuators are thermal actuators and said mirrors have a coefficient of thermal expansion and a thickness such that a desired deformation is produced by said thermal actuators.

7. An adaptive optic as in claim 6, further comprising heat sensors located at each thermal actuator.

8. An adaptive optic for high precision lithography exposure, comprising:
    an optical system having one or more deformable reflective mirrors for use with EUV wavelengths in the range of 1 to 50 nanometers, said deformable mirrors having an optimal design shape;
    a metrology system to detect aberrations in the optical system; and
    for each of said one or more deformable mirrors, a plurality of deforming elements to deform each respective one or more deformable mirrors responsive to said metrology system to correct the aberrations to within an allowable deformation limit of said optimal design shape.

9. An adaptive optic as in claim 8, wherein said plurality of deforming elements further comprises:
    an array of actuators operating at discrete intervals across the back surface of the mirrors so as to produce a continuous deformation; and
    a control system responsive to said metrology system for controlling the actuators to correct the aberrations.

10. An adaptive optic as in claim 9, wherein the actuators are flexible air bladders.

11. An adaptive optic as in claim 9, wherein the actuators are thermal actuators further comprising resistive elements for heating and peltier junctions for cooling.

12. An adaptive optic as in claim 1, wherein said allowable deformation limit is ten percent of an EUV wavelength used for said high precision lithography exposure.

13. An adaptive optic as in claim 12, wherein said EUV wavelength is in the range of 12 to 14 nanometers.

14. An adaptive optic as in claim 13, wherein said EUV wavelenth is 13.5 nanometers±0.1 nanometers and said allowable deformation limit is 1 nanometer.

15. An adaptive optic as in claim 14, wherein the actuators are flexible air bladders.

16. An adaptive optic as in claim 14, wherein the actuators are thermal actuators further comprising resistive elements for heating and peltier junctions for cooling.

* * * * *